United States Patent
Cheng et al.

(10) Patent No.: US 11,996,480 B2
(45) Date of Patent: May 28, 2024

(54) VERTICAL TRANSISTOR WITH LATE SOURCE/DRAIN EPITAXY

(71) Applicant: International Business Machines Corporation, Armonk, NY (US)

(72) Inventors: Kangguo Cheng, Schenectady, NY (US); Juntao Li, Cohoes, NY (US); Shogo Mochizuki, Mechanicville, NY (US); Choonghyun Lee, Chigasaki (JP)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 17/470,686

(22) Filed: Sep. 9, 2021

(65) Prior Publication Data

US 2023/0072305 A1 Mar. 9, 2023

(51) Int. Cl.
*H01L 29/78* (2006.01)
*H01L 29/08* (2006.01)
*H01L 29/40* (2006.01)
*H01L 29/417* (2006.01)
*H01L 29/66* (2006.01)

(52) U.S. Cl.
CPC ...... *H01L 29/7827* (2013.01); *H01L 29/0847* (2013.01); *H01L 29/401* (2013.01); *H01L 29/41741* (2013.01); *H01L 29/66666* (2013.01)

(58) Field of Classification Search
CPC ............. H01L 29/7827; H01L 29/0847; H01L 29/401; H01L 29/41741; H01L 29/66666; H01L 29/165
USPC ........................................................ 257/329
See application file for complete search history.

(56) References Cited

U.S. PATENT DOCUMENTS

| | | |
|---|---|---|
| 8,759,844 B2 | 6/2014 | Iwasa |
| 8,946,018 B2 | 2/2015 | Guha et al. |
| 9,190,417 B2 | 11/2015 | Chang et al. |
| 9,685,381 B2 | 6/2017 | Goel et al. |
| 9,728,466 B1 | 8/2017 | Mallela et al. |
| 9,773,913 B1 | 9/2017 | Balakrishnan et al. |
| 10,217,846 B1 | 2/2019 | Xie et al. |
| 10,396,208 B2 * | 8/2019 | Cheng ............... H01L 29/78696 |
| 10,453,940 B1 * | 10/2019 | Mochizuki ........ H01L 29/66545 |
| 10,461,173 B1 * | 10/2019 | Jacob ................ H01L 29/66545 |
| 10,727,339 B2 | 7/2020 | Chu-Kung et al. |
| 2017/0301776 A1 * | 10/2017 | Zhang ................. H01L 29/7827 |
| 2018/0204833 A1 * | 7/2018 | Cheng ............... H01L 29/78642 |
| 2018/0240873 A1 | 8/2018 | Cheng et al. |
| 2018/0269312 A1 * | 9/2018 | Xie .................... H01L 29/78654 |
| 2018/0342507 A1 * | 11/2018 | Xie ................. H01L 21/823487 |
| 2019/0051563 A1 * | 2/2019 | Park ................ H01L 21/823431 |

(Continued)

FOREIGN PATENT DOCUMENTS

EP 3588544 A1 1/2020

*Primary Examiner* — Mohammad M Hoque
(74) *Attorney, Agent, or Firm* — Edward J. Wixted, III

(57) ABSTRACT

VFET devices having symmetric, sharp channel-to-source/drain junctions and techniques for fabrication thereof using a late source/drain epitaxy process are provided. In one aspect, a VFET device includes: at least one vertical fin channel disposed on a substrate; a gate stack alongside the at least one vertical fin channel; a bottom source/drain region directly below the at least one vertical fin channel having, for example, an inverted T-shape with a flat bottom; and a top source/drain region over the at least one vertical fin channel. A method of fabricating a VFET device is also provided.

15 Claims, 14 Drawing Sheets

(56) References Cited

U.S. PATENT DOCUMENTS

2019/0157452 A1* 5/2019 Kim .................... H01L 29/4232
2019/0378837 A1* 12/2019 Miao ................. H01L 21/76232
2021/0242025 A1* 8/2021 Kim .................... H01L 29/6653

* cited by examiner

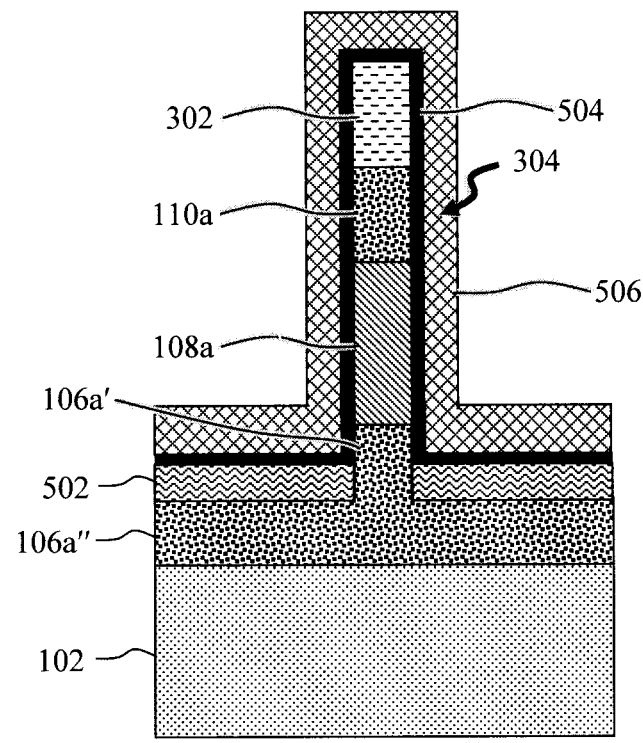
A-A'  FIG. 5
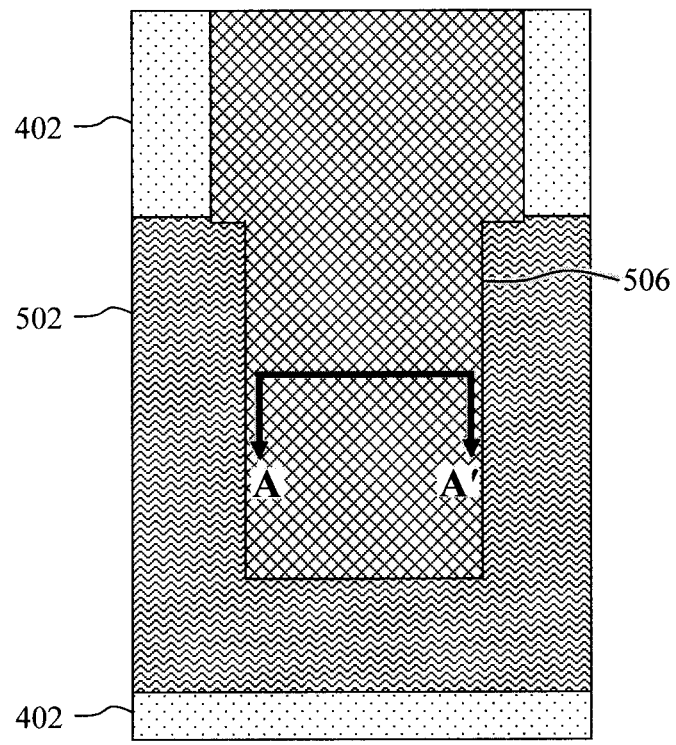
FIG. 6

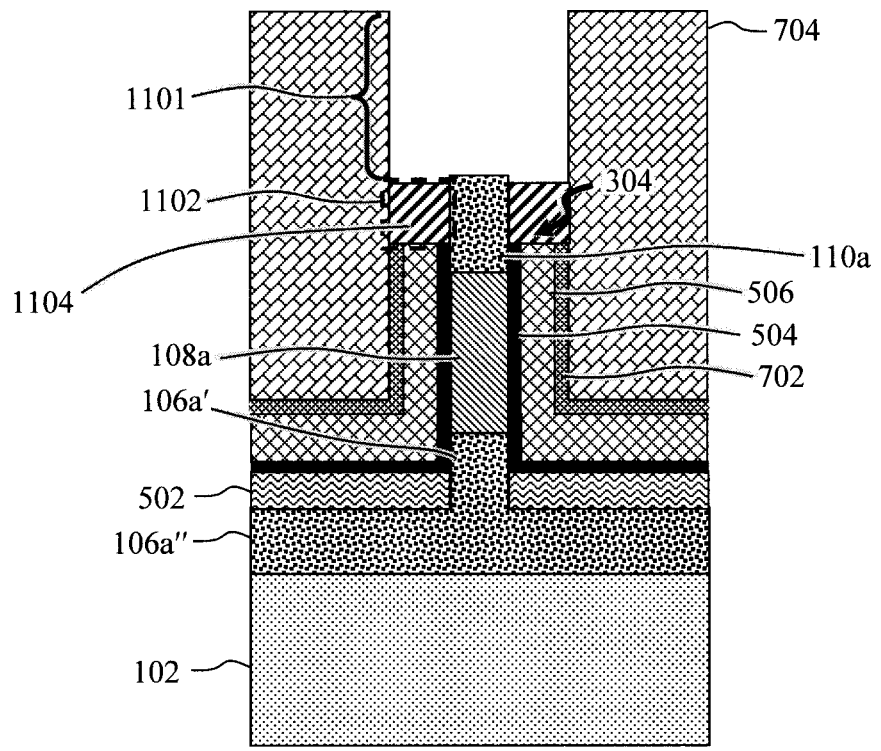
A-A'  FIG. 11
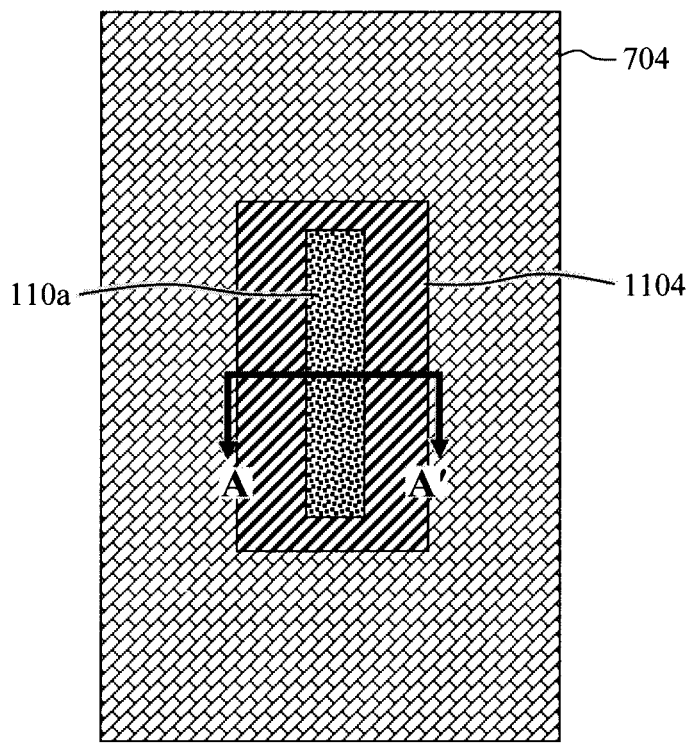
FIG. 12

VERTICAL TRANSISTOR WITH LATE SOURCE/DRAIN EPITAXY

FIELD OF THE INVENTION

The present invention relates to vertical field-effect transistor (VFET) devices, and more particularly, to VFET devices having symmetric, sharp channel-to-source/drain junctions and techniques for fabrication thereof using a late source/drain epitaxy process.

BACKGROUND OF THE INVENTION

As opposed to planar complementary metal-oxide-semiconductor (CMOS) devices, vertical transport field effect transistor (VFET) devices are oriented with a vertical fin channel disposed on a bottom source/drain and a top source/drain disposed on the fin channel. VFET devices are being pursued as a viable device option for continued CMOS scaling.

There are, however, some notable challenges associated with implementing a VFET design. For instance, one challenge is being able to precisely control the gate length (Lg) of a VFET. Namely, unlike a planar FET, the physical gate length (Lg) of a VFET is not defined by lithography. Instead, the physical gate length (Lg) of a VFET is defined by a timed recess process of a metal gate, causing a significant variation.

Another challenge for VFET fabrication lies in the ability to produce sharp channel-to-source/drain junctions. With conventional approaches, the bottom source/drain epitaxy is grown in the substrate in between the vertical fin channels, followed by a thermally-driven diffusion of the dopant species. Doing so, however, means that the source/drain region dopant species has to diffuse a relatively long distance through the substrate in order to form channel-to-source/drain junctions. This diffusion process can be difficult to control in order to achieve a well-defined junction. Furthermore, the large volume of substrate material between the epitaxy can result in a relatively high bottom source/drain resistance.

Therefore, improved techniques for VFET device fabrication that produce symmetric, sharp channel-to-source/drain junctions would be desirable.

SUMMARY OF THE INVENTION

The present invention provides vertical field-effect transistor (VFET) devices having symmetric, sharp channel-to-source/drain junctions and techniques for fabrication thereof using a late source/drain epitaxy process. In one aspect of the invention, a VFET device is provided. The VFET device includes: at least one vertical fin channel disposed on a substrate; a gate stack alongside the at least one vertical fin channel; a bottom source/drain region directly below the at least one vertical fin channel; and a top source/drain region over the at least one vertical fin channel.

In another aspect of the invention, another VFET device is provided. The VFET device includes: at least one vertical fin channel disposed on a substrate; a gate stack alongside the at least one vertical fin channel; a bottom source/drain region directly below the at least one vertical fin channel offset from the gate stack by bottom spacers, wherein the bottom source/drain region has an inverted T-shape with a flat bottom; and a top source/drain region over the at least one vertical fin channel offset from the gate stack by top spacers.

In yet another aspect of the invention, a method of fabricating a VFET device is provided. The method includes: forming a stack on a substrate comprising a bottom sacrificial layer disposed on the substrate, an active layer disposed on the bottom sacrificial layer, and a top sacrificial layer disposed on the active layer; patterning at least one fin in the stack, wherein the at least one fin includes a patterned portion of the bottom sacrificial layer, a patterned portion of the active layer and a patterned portion of the top sacrificial layer, and wherein the patterned portion of the active layer serves as a vertical fin channel of the VFET device; forming gate stacks alongside the at least one fin; and removing and replacing the patterned portion of the bottom sacrificial layer and the patterned portion of the top sacrificial layer with an epitaxial material to simultaneously form a bottom source/drain region and a top source/drain region of the VFET device.

A more complete understanding of the present invention, as well as further features and advantages of the present invention, will be obtained by reference to the following detailed description and drawings.

BRIEF DESCRIPTION OF THE DRAWINGS

FIG. 5 is an A-A' cross-sectional view illustrating bottom spacers having been formed at the base of the fin(s) and gate stacks having been formed alongside the fin(s) according to an embodiment of the present invention;

FIG. 6 is a top-down view illustrating the gate stack having been formed alongside the fin(s) according to an embodiment of the present invention;

FIG. 11 is an A-A' cross-sectional view illustrating the liner, the workfunction-setting metal(s) and the gate dielectric having been recessed below a top surface of the patterned top sacrificial layer forming a trench in the first ILD over the fin(s) and forming divots alongside the patterned top sacrificial layer, and top spacers having been formed in the divots according to an embodiment of the present invention;

FIG. 12 is a top-down view illustrating the top spacers having been formed alongside the patterned top sacrificial layer according to an embodiment of the present invention;

DETAILED DESCRIPTION OF PREFERRED EMBODIMENTS

Figure 1:
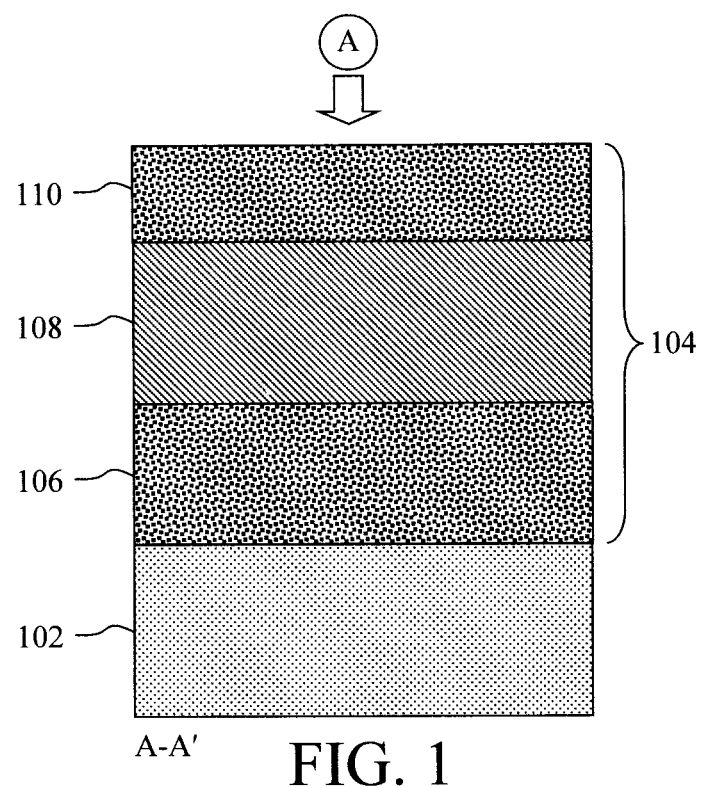
FIG. 1 is an A-A' cross-sectional view illustrating a stack of sacrificial/active layers having been formed on a substrate with a bottom sacrificial layer disposed on the substrate, an active layer disposed on the bottom sacrificial layer, and a top sacrificial layer disposed on the active layer according to an embodiment of the present invention.

Provided herein are improved techniques for fabricating vertical field-effect transistor (VFET) devices using a late source/drain epitaxy process meaning that the epitaxy for the top and bottom source/drain regions is formed near the end of the fabrication flow. To do so, sacrificial layers are employed in the process that serve as placeholders for the top and bottom source/drain regions. Later, these sacrificial layers are removed and replaced with the epitaxy for the top and bottom source/drain. Thus, the term 'sacrificial,' as used herein, generally refers to a structure that is removed, in whole or in part, during fabrication.

Advantageously, by way of this unique process the top and bottom source/drain epitaxy will be grown on pristine {100} planes which are the optimal crystalline planes to grow the best quality epitaxy in silicon technology. Further, as will be described in detail below, the epitaxy is grown for the top and bottom source/drain regions at the same time, thus requiring only a one-time thermal budget for the channel-to-source/drain junction formation. Notably, doing so enables the formation of symmetric, sharp channel-to-source/drain junctions, improving device performance and reducing variability.

Also, as provided above, conventional approaches to VFET fabrication typically involve growing the bottom source/drain epitaxy in the substrate at the base of the fins, and then using a thermal treatment to diffuse the dopant species. However, this process requires that the dopant species be diffused through a large volume of substrate material. This diffusion process can be difficult to control, and oftentimes results in a relatively high bottom source/drain resistance. Advantageously, the present techniques enable the formation of a uniform epitaxy for the bottom source/drain regions thereby minimizing bottom source/drain region resistance variability and thus device variability.

Given the above overview, an exemplary methodology for fabricating a VFET device using the present late source/drain epitaxy-based process is now described by way of reference to FIGS. 1-28. In the following figures, different views of the device structure will be used to depict the fabrication process, including top-down views and various cross-sectional cuts. For instance, as shown in FIG. 1 (a cross-sectional view A-A'), the process begins with the formation of a stack 104 of sacrificial/active layers on a substrate 102.

According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor material(s), such as Si, Ge, SiGe and/or a III-V semiconductor. Further, substrate 102 may already have pre-built structures (not shown) such as transistors, diodes, capacitors, resistors, interconnects, wiring, etc.

As shown in FIG. 1, stack 104 includes a bottom sacrificial layer 106 disposed on the substrate 102, an active layer 108 disposed on the bottom sacrificial layer 106, and a top sacrificial layer 110 disposed on the active layer 108. As highlighted above, the bottom sacrificial layer 106 and the top sacrificial layer 110 will serve as placeholders for the (late) bottom and top source/drain regions, respectively.

The active layer 108 will be used to form the vertical fin channels of the VFET device. As provided above, being able to precisely control the gate length (Lg) of a conventional VFET can be challenging. However, forming the active layer 108 in this manner as the basis for the vertical fin channels precisely determines the Lg of the resulting VFET device.

In general, the materials chosen for bottom sacrificial layer 106 and the top sacrificial layer 110 need to have etch selectivity relative to, among other things, the active layer 108 and the substrate 102. This will enable these sacrificial layers to be removed later on in the process and replaced with the (late) epitaxy for the bottom source/drain regions. For instance, according to an exemplary embodiment, the bottom sacrificial layer 106 and the top sacrificial layer 110 are each formed from SiGe, while the active layer 108 is formed from intrinsic (i.e., undoped) Si.

In one embodiment, an epitaxial growth process is employed to grow alternating epitaxial SiGe, epitaxial intrinsic Si, and epitaxial SiGe on the substrate 102 to form the bottom sacrificial layer 106, the active layer 108, and the top sacrificial layer 110, respectively. According to an exemplary embodiment, the bottom sacrificial layer 106 and the top sacrificial layer 110 each has a thickness of from about 5 nanometers (nm) to about 30 nm and ranges therebetween, and the active layer 108 has a thickness of from about 10 nm to about 40 nm and ranges therebetween.

Figure 2:
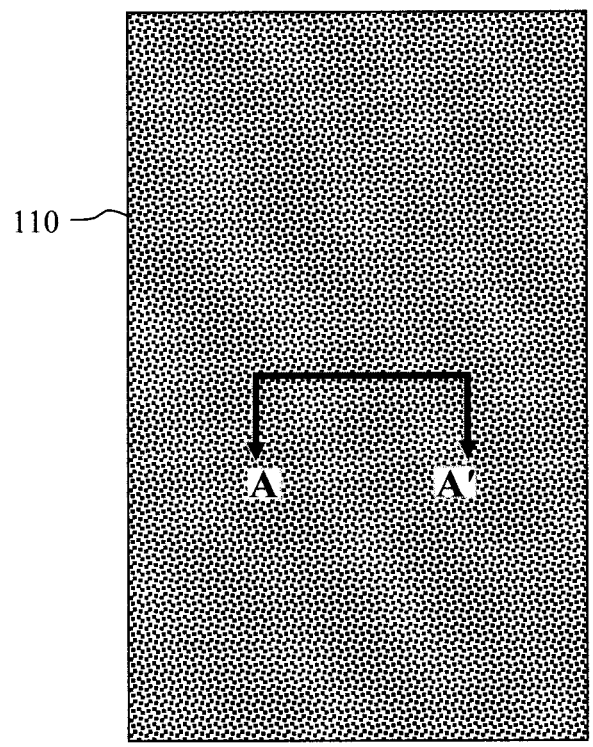
FIG. 2 is a top-down view illustrating an orientation of the A-A' cuts depicted in FIG. 1 and in various other figures according to an embodiment of the present invention.

FIG. 2, a top-down view from viewpoint A (see FIG. 1), illustrates the orientation of the A-A' cuts (of the actual device region) depicted in FIG. 1 and in the various other figures described below. From the top-down view of FIG. 2, only the topmost layer of the stack, i.e., the top sacrificial layer 110, is visible.

At least one fin 304 is then patterned in the stack 104. See FIG. 3 (a cross-sectional view A-A'). To do so, a fin hardmask 302 is first formed on the stack 104 marking the footprint and location of the at least one fin. Suitable hardmask materials include, but are not limited to, nitride hardmask materials such as silicon nitride (SiN), silicon oxynitride (SiON) and/or silicon carbide nitride (SiCN). Standard lithography and etching techniques can be employed to form the fin hardmask 302. With standard lithography and etching techniques, a lithographic stack (not shown), e.g., photoresist/organic planarizing layer (OPL)/anti-reflective coating (ARC), is used to pattern the fin hardmask 302 with the footprint and location of the features to be patterned (in this case the at least one fin). Alternatively, the hardmask can be formed by other suitable techniques, including but not limited to, sidewall image transfer (SIT), self-aligned double patterning (SADP), self-aligned quadruple patterning (SAQP), and other self-aligned multiple patterning (SAMP).

Figure 3:
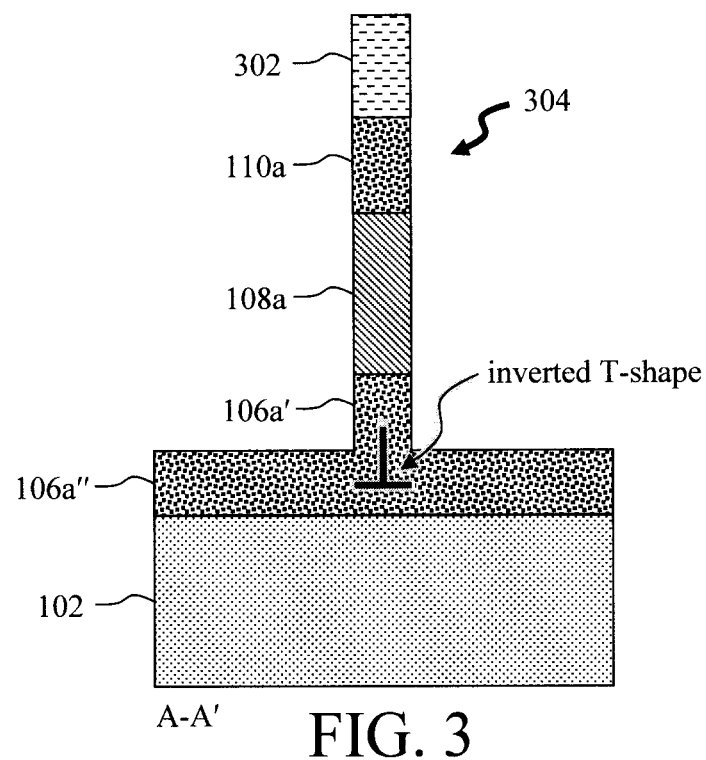
FIG. 3 is an A-A' cross-sectional view illustrating a fin hardmask having been used to pattern at least one fin in the stack, the at least one fin having patterned portions of the bottom sacrificial layer, the active layer and the top sacrificial layer according to an embodiment of the present invention.
Figure 4:
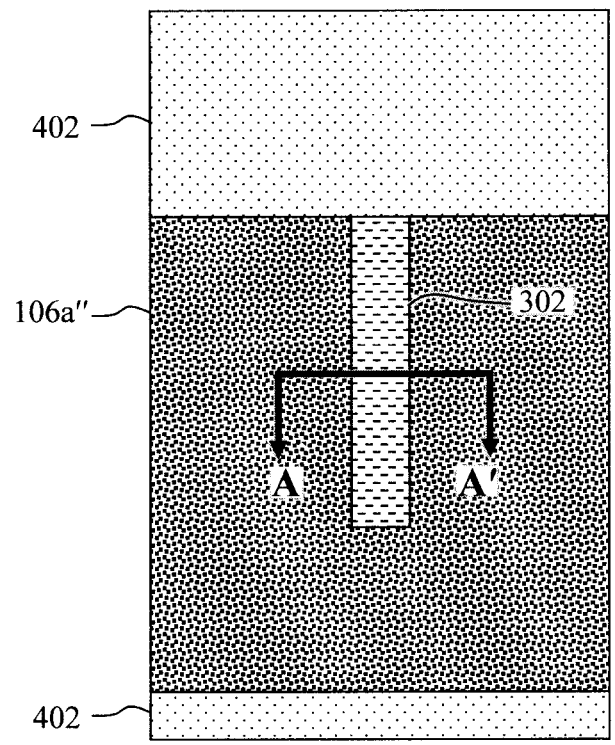
FIG. 4 is a top-down view illustrating isolation regions having been formed in the substrate at the base of the fin(s) according to an embodiment of the present invention.
Figure 7:
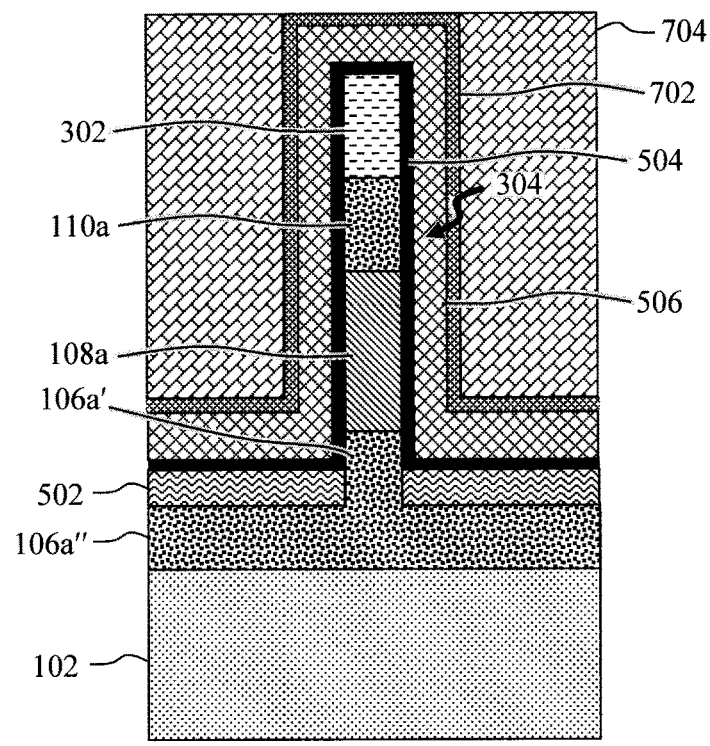
FIG. 7 is an A-A' cross-sectional view illustrating a liner having been formed on the gate stack over the fin(s), and a (first) interlayer dielectric (ILD) having been deposited over the gate stack and liner according to an embodiment of the present invention.

An etch is then used to transfer the pattern from the fin hardmask 302 to the underlying layers of stack 104 to form the fin(s) 304. A directional (anisotropic) etching process such as reactive ion etching (RIE) can be employed for the fin etch. As shown in FIG. 3, as-patterned, the fins 304 extend through the top sacrificial layer 110, the active layer 108, and partway through the bottom sacrificial layer 106. For clarity, the patterned portions of the active layer and the top sacrificial layer are now given the reference numerals 108a and 110a, respectively. It is notable that patterning the fin(s) 304 in this manner results in the patterned bottom sacrificial layer now having a first portion 106a' that is part of the fin(s) 304 and a second portion 106a" underlying the first portion 106a'. As shown in FIG. 3, these first and second portions 106a' and 106a" of the patterned bottom sacrificial layer have an inverted T-shape configuration in cross-section. As will be described in detail below, subsequent removal and replacement of these first and second portions 106a' and 106a" of the patterned bottom sacrificial layer with the (late) epitaxy will result in the bottom source/drain regions also having this unique inverted T-shape.

Following the patterning of the fin(s) 304, isolation regions 402 (e.g., shallow trench isolations (STIs) are formed in the substrate 102 at the base of the fin(s) 304. See FIG. 4 (a top-down view). By way of example only, the isolation regions 402 can be formed by depositing a dielectric material and chemical-mechanical polishing (CMP) of the dielectric material, followed by dielectric recess. Suitable dielectric materials for isolation regions 402 include, but are not limited to, oxide materials such as silicon oxide (SiOx) which can be deposited using a process such as chemical vapor deposition (CVD), atomic layer deposition (ALD) or physical vapor deposition (PVD).

Bottom spacers 502 are then formed at the base of the fin(s) 304 on the second portion 106a" of the patterned bottom sacrificial layer. See FIG. 5 (a cross-sectional view A-A'). Suitable materials for the bottom spacers 502 include, but are not limited to, oxide spacer materials such as SiOx and/or silicon oxycarbide (SiOC) and/or nitride spacer materials such as SiN, silicon-boron-nitride (SiBN), siliconborocarbonitride (SiBCN) and/or silicon oxycarbonitride (SiOCN).

According to an exemplary embodiment, the bottom spacers 502 are formed using a directional deposition process whereby a greater amount of the spacer material is deposited on horizontal surfaces (including on top of the second portion 106a" of the patterned bottom sacrificial layer) as compared to vertical surfaces (such as along sidewalls of the fin(s) 304). Thus, when an etch is used on the spacer material, the timing of the etch needed to remove the spacer material from the vertical surfaces will leave the bottom spacers 502 shown in FIG. 5 on since a greater amount of the spacer material was deposited on the second portion 106a" of the patterned bottom sacrificial layer. By way of example only, a high-density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces. According to an exemplary embodiment, the bottom spacers 502 have a thickness of from about 5 nm to about 20 nm and ranges therebetween.

Gate stacks are then formed alongside the fin(s) 304. As shown in FIG. 5, the gate stacks include a gate dielectric 504 disposed on the fin(s) 304 and at least one workfunction-setting metal 506 disposed on the gate dielectric 504.

Although not explicitly shown in the figures, an interfacial oxide may be formed on the exposed surfaces of the fin(s) 304 prior to the gate dielectric 504 such that the gate dielectric 504 is disposed on the fin(s) 304 over the interfacial oxide. By way of example only, the interfacial oxide can be formed on the exposed surfaces of the fin(s) 304 by a thermal oxidation, a chemical oxidation, or any other suitable oxide formation process. According to an exemplary embodiment, the interfacial oxide has a thickness of from about 0.5 nm to about 5 nm and ranges therebetween, e.g., about 1 nm.

Suitable materials for the gate dielectric 504 include, but are not limited to, silicon oxide (SiOx), silicon nitride (SiN), silicon oxynitride (SiOxNy), high-κ materials, or any combination thereof. The term "high-κ" as used herein refers to a material having a relative dielectric constant κ which is much higher than that of silicon dioxide (e.g., a dielectric constant κ is about 25 for hafnium oxide (HfO$_2$) rather than 3.9 for SiO$_2$). Suitable high-κ materials include, but are not limited to, metal oxides such as HfO$_2$, hafnium silicon oxide (HfSiO), hafnium silicon oxynitride (HfSiO), lanthanum oxide (La$_2$O$_3$), lanthanum aluminum oxide (LaAlO$_3$), zirconium oxide (ZrO$_2$), zirconium silicon oxide (ZrSiO$_4$), zirconium silicon oxynitride (ZrSiOxNy), tantalum oxide (TaOx), titanium oxide (TiO), barium strontium titanium oxide (BaO$_6$SrTi$_2$), barium titanium oxide (BaTiO$_3$), strontium titanium oxide (SrTiO$_3$), yttrium oxide (Y$_2$O$_3$), aluminum oxide (Al$_2$O$_3$), lead scandium tantalum oxide (Pb(Sc,Ta)O$_3$) and/or lead zinc niobite (Pb(Zn,Nb)O). The high-κ material can further include dopants such as lanthanum (La), aluminum (Al) and/or magnesium (Mg). The gate dielectric 504 can be deposited using a process or combination of processes such as, but not limited to, thermal oxidation, chemical oxidation, thermal nitridation, plasma oxidation, plasma nitridation, CVD, ALD, etc. According to an exemplary embodiment, the gate dielectric 504 has a thickness of from about 1 nm to about 5 nm and ranges therebetween.

Suitable workfunction-setting metals 506 include, but are not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), titanium carbide (TiC), titanium aluminum carbide (TiAlC), tantalum carbide (TaC) and/or hafnium carbide (HfC). The workfunction-setting metal(s) 506 can be deposited using a process or combination of processes such as, but not limited to, CVD, ALD, PVD, sputtering, plating, evaporation, ion beam deposition, electron beam deposition, laser assisted deposition, chemical solution deposition, etc. According to an exemplary embodiment, the workfunction-setting metal(s) 506 has a thickness of from about 5 nm to about 10 nm and ranges therebetween. FIG. 6 provides a top-down view of the VFET device structure following formation of the bottom spacers and gate stack (of which only the workfunction-setting metal(s) 506 is visible).

A (conformal) liner 702 is then formed on the gate stack (i.e., on the workfunction-setting metal(s) 506) over the fin(s) 304. See FIG. 7 (a cross-sectional view A-A'). Suitable materials for liner 702 include, but are not limited to, nitride materials such as SiN and/or SiCN, which can be deposited using a process such as CVD, ALD or PVD. According to an exemplary embodiment, liner 702 has a thickness of from about 1 nm to about 3 nm and ranges therebetween.

An interlayer dielectric (ILD) 704 is then deposited over the gate stack and liner 702. Suitable materials for ILD 704 include, but are not limited to, oxide materials such as SiOx and/or organosilicate glass (SiCOH) and/or ultralow-κ interlayer dielectric (ULK-ILD) materials, e.g., having a dielectric constant κ of less than about 2.7. Suitable ultralow-κ dielectric materials include, but are not limited to, porous organosilicate glass (pSiCOH). A process such as CVD, ALD, or PVD can be used to deposit the ILD 704. Following deposition, the ILD 704 can be polished down to the liner 702 using a process such as CMP.

Figure 8:
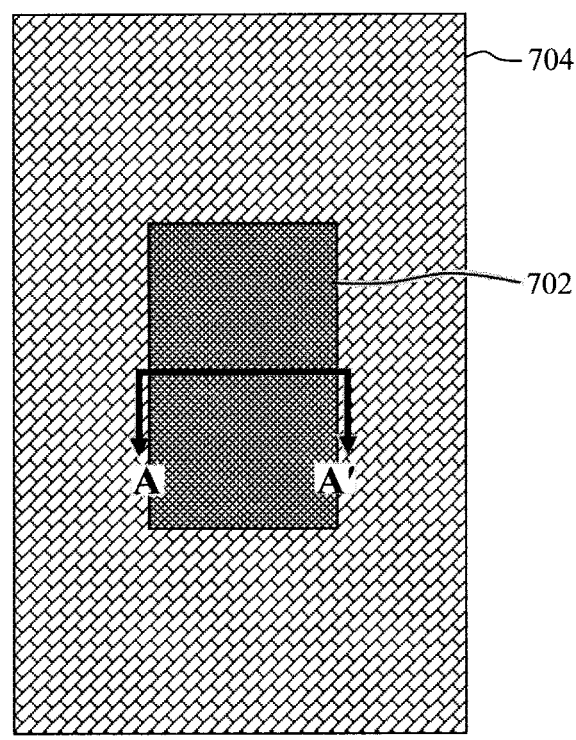
FIG. 8 is a top-down view illustrating the liner and the first ILD having been formed over the fin(s) according to an embodiment of the present invention.

FIG. 8 provides a top-down view of the VFET device structure following formation of the liner 702 and ILD 704. As shown in FIG. 8, following deposition, the ILD 704 has been polished down to the liner 702, thereby exposing a portion of the liner 702 over the fin(s) 304.

Figure 9:
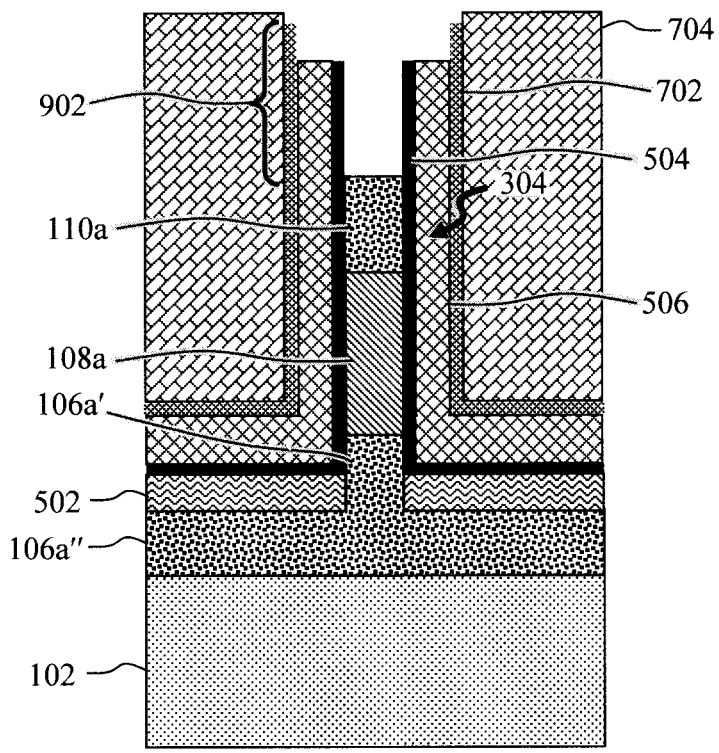
FIG. 9 is an A-A' cross-sectional view illustrating the liner, the workfunction-setting metal(s), the gate dielectric, and the fin hardmask have been removed from the top of the fin(s) according to an embodiment of the present invention.

Exposure of the liner 702 enables its removal, as well as the underlying fin hardmask 302 and gate stack materials over the fin(s) 304. See FIG. 9 (a cross-sectional view A-A'). Ultimately, the goal will be to uncover the patterned top sacrificial layer 110a, which can then be removed and replaced with the epitaxy for the top source/drain region. As shown in FIG. 9, the exposed liner 702, the workfunction-setting metal(s) 506, gate dielectric 504, and fin hardmask 302 have been removed from the top of the fin(s) 304. According to an exemplary embodiment, a RIE or a series of RIE steps is used to remove the liner 702, the workfunction-setting metal(s) 506, gate dielectric 504, and fin hardmask 302 from the top of the fin(s) 304. For instance, an etch-back of the liner 702 at the top of the fin(s) 304 exposes the underlying gate stack materials, i.e., the workfunction-setting metal(s) 506 and the gate dielectric 504, which are then removed. In turn, removal of the workfunction-setting metal(s) 506 and the gate dielectric 504 exposes the underlying fin hardmask 302 which is then removed. Removal of the fin hardmask 302 exposes the underlying patterned top sacrificial layer 110a.

Figure 10:
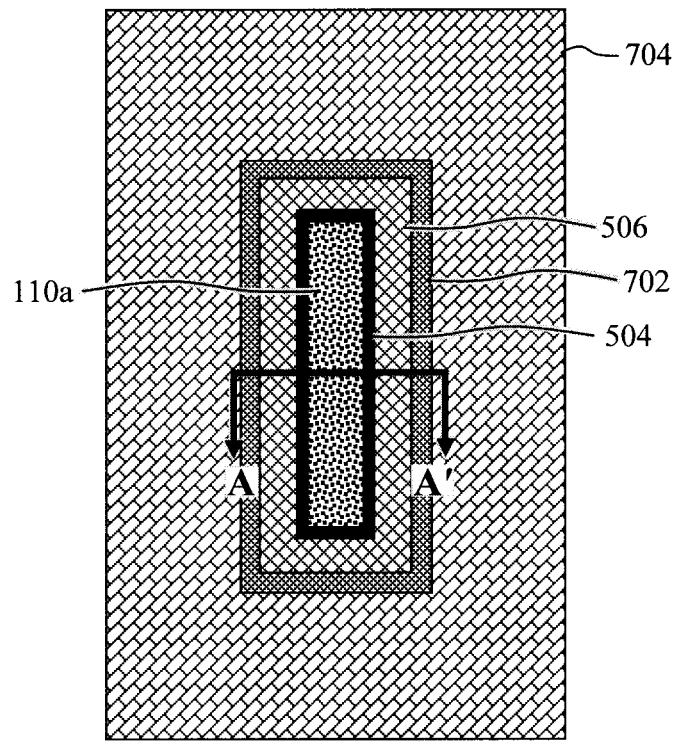
FIG. 10 is a top-down view illustrating the liner, the workfunction-setting metal(s), the gate dielectric, and the fin hardmask have been removed from the top of the fin(s) according to an embodiment of the present invention.
Figure 13:
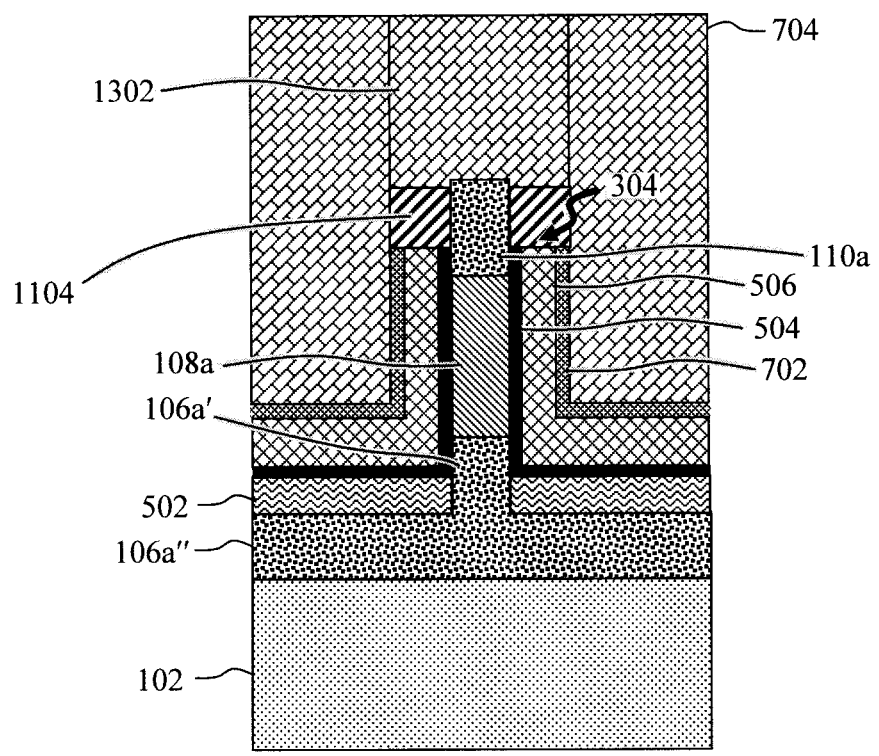
FIG. 13 is an A-A' cross-sectional view illustrating the trench having been filled with a (second) ILD covering the top spacers according to an embodiment of the present invention.

FIG. 10 provides a top-down view of the VFET device structure following removal of the liner 702, the workfunction-setting metal(s) 506, gate dielectric 504, and fin hardmask 302 from the top of the fin(s) 304. Notably, as shown in FIG. 10, doing so exposes underlying patterned top sacrificial layer 110a.

Referring briefly back to FIG. 9, it can be seen that the top-down patterning of the liner 702, gate stack materials and fin hardmask 302 in this manner leaves portions 902 of the liner 702, workfunction-setting metal(s) 506 and gate dielectric 504 remaining along the sidewalls above the patterned top sacrificial layer 110a. These portions 902 of the liner 702, workfunction-setting metal(s) 506 and gate dielectric 504 will need to be recessed in order to form top spacers alongside the patterned top sacrificial layer 110a.

Namely, an etch is next performed to remove the portions 902 of the liner 702, gate stack (i.e., workfunction-setting metal(s) 506 and gate dielectric 504) alongside the patterned top sacrificial layer 110a. A non-directional (i.e., isotropic) etching process such as a wet chemical or gas phase etch can be employed. See FIG. 11 (a cross-sectional view A-A'). As shown in FIG. 11, the liner 702, workfunction-setting metal(s) 506 and gate dielectric 504 are now recessed below a top surface of the patterned top sacrificial layer 110a, forming a trench 1101 in the ILD 704 over the fin(s) 304 (which exposes the patterned top sacrificial layer 110a) and forming divots 1102 (shown outlined with dashes) alongside the patterned top sacrificial layer 110a.

Top spacers 1104 are then formed in the divots 1102 alongside the patterned top sacrificial layer 110a. Suitable materials for the top spacers 1104 include, but are not limited to, oxide spacer materials such as SiOx and/or SiOC and/or nitride spacer materials such as SiN, SiBN, SiBCN and/or SiOCN. According to an exemplary embodiment, the top spacers 1104 are formed by conformal deposition of the spacer material over the ILD 704 and into the trench 1101 and divots 1102, pinching off the gaps between the ILD 704 and the patterned top sacrificial layer 110a, and filling the divots 1102. An etch-back of the spacer material (e.g., using an oxide- or nitride-selective RIE as the case may be) forms top spacers 1104 in the divots 1102.

As shown in FIG. 11, according to an exemplary embodiment, a top surface of the top spacers 1104 is coplanar with or slightly below a top surface of the patterned top sacrificial layer 110a, while a bottom surface of the top spacers 1104 is above a bottom surface of the patterned top sacrificial layer 110a. As will be described in detail below, this configuration at the top of the fin(s) 304 will result in a unique T-shaped (late) epitaxy for the top source/drain region.

FIG. 12 provides a top-down view of the VFET device structure following formation of the top spacers 1104. As shown in FIG. 12, the top spacers 1104 are now present alongside the patterned top sacrificial layer 110a. The liner 702, workfunction-setting metal(s) 506 and gate dielectric 504 are no longer visible from this view as they are now covered by the top spacers 1104.

The trench 1101 is then filled with an ILD 1302 covering top spacers 1104. See FIG. 13 (a cross-sectional view A-A'). For clarity, the terms 'first' and 'second' may also be used herein when referring to ILD 704 and ILD 1302, respectively. Suitable materials for ILD 1302 include, but are not limited to, oxide materials such as SiOx and/or SiCOH and/or ULK-ILD materials such as pSiCOH. A process such as CVD, ALD, or PVD can be used to deposit the ILD 1302. Following deposition, the ILD 1302 can be polished using a process such as CMP.

Figure 14:
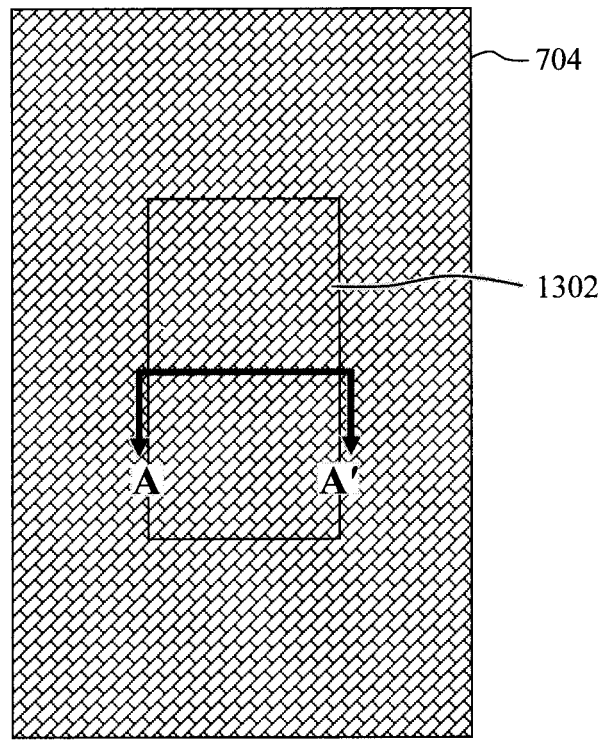
FIG. 14 is a top-down view illustrating the second ILD having been deposited over the top spacers according to an embodiment of the present invention.
Figure 15:
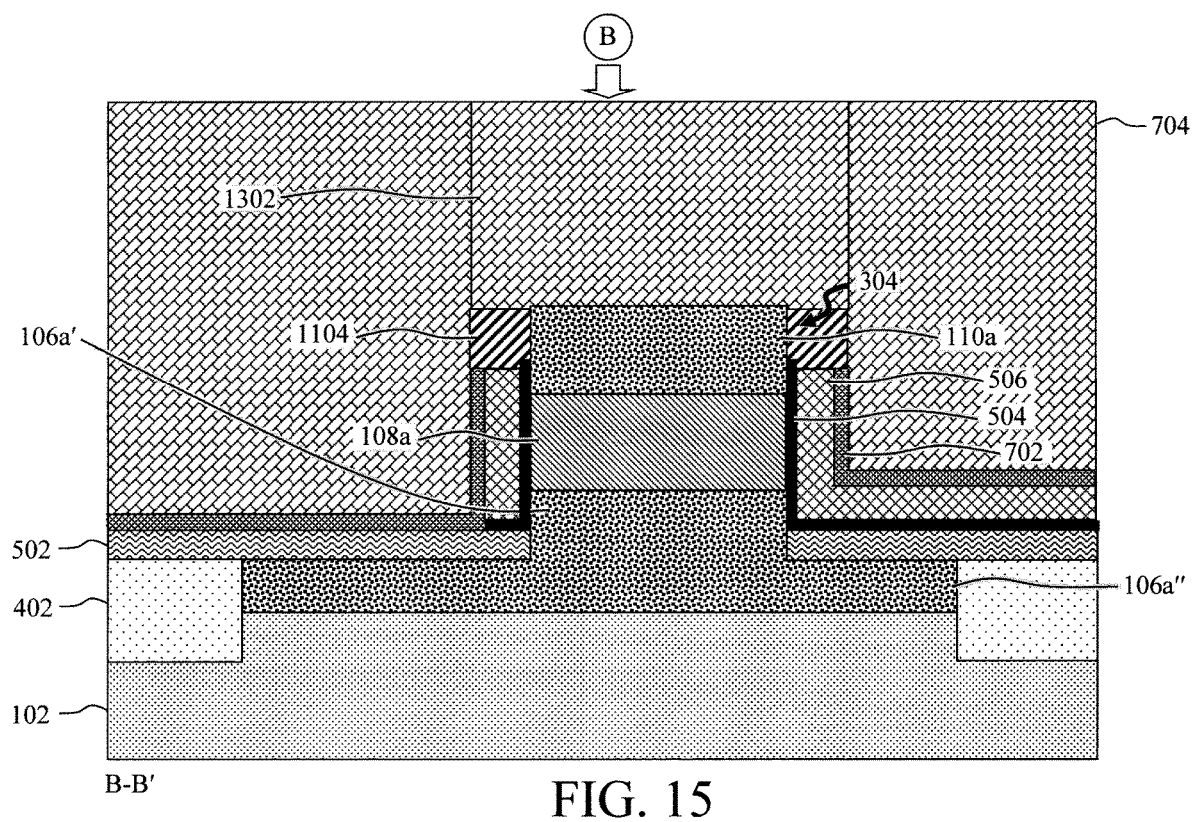
FIG. 15 is a B-B' cross-sectional view illustrating the device structure from another perspective according to an embodiment of the present invention.

FIG. 14 provides a top-down view of the VFET device structure following deposition of the ILD 1302. The top spacers 1104 are no longer visible from this view as they are now covered by the ILD 1302.

Figure 16:
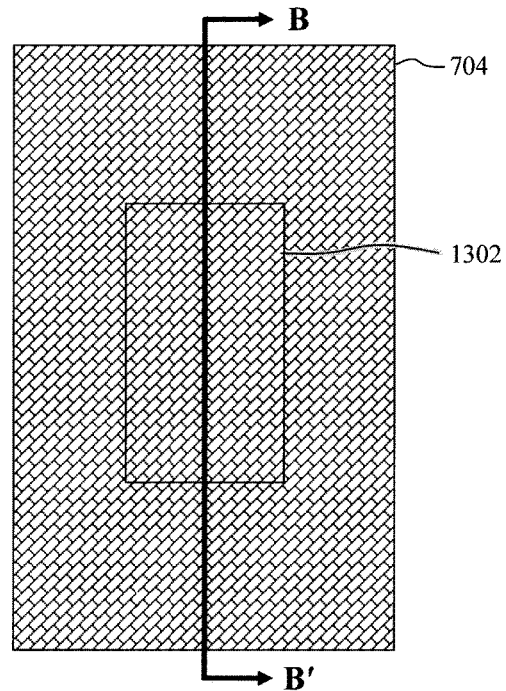
FIG. 16 is a top-down view illustrating an orientation of the B-B' cuts depicted in FIG. 15 and in various other figures according to an embodiment of the present invention.

In order to help illustrate the following steps of the fabrication process, the views of the device structure will now shift to cross-sectional views B-B' which depict cuts through one of the fin(s) 304 along the length of that fin 304. By contrast, the cross-sectional views A-A' employed above depict cuts through one of the fin(s) 304 perpendicular to that fin 304. For instance, referring to FIG. 15 (a cross-sectional view B-B'), it can be seen that the patterned active layer 108a is present between the first/second portions 106a'/106a" of the patterned bottom sacrificial layer and the patterned top sacrificial layer 110a. The patterned active layer 108a will serve as a vertical fin channel of the VFET device. The gate stack (i.e., the workfunction-setting metal(s) 506 and gate dielectric 504) is present alongside the vertical fin channel. As highlighted above, the first/second portions 106a'/106a" of the patterned bottom sacrificial layer and the patterned top sacrificial layer 110a will eventually be removed (at the same time) and replaced with the (late) epitaxy for the bottom and top source/drain regions, respectively. Notably, the first/second portions 106a'/106a" of the patterned bottom sacrificial layer have the above-described inverted T-shaped configuration that will be imparted to the epitaxy for the bottom source/drain region. As will be described in detail below, the epitaxy for the top source/drain region will mirror that T-shaped design. FIG. 16, a top-down view from viewpoint B (see FIG. 15), illustrates the orientation of the B-B' cuts depicted in FIG. 15 and in the various other figures described below.

Figure 17:
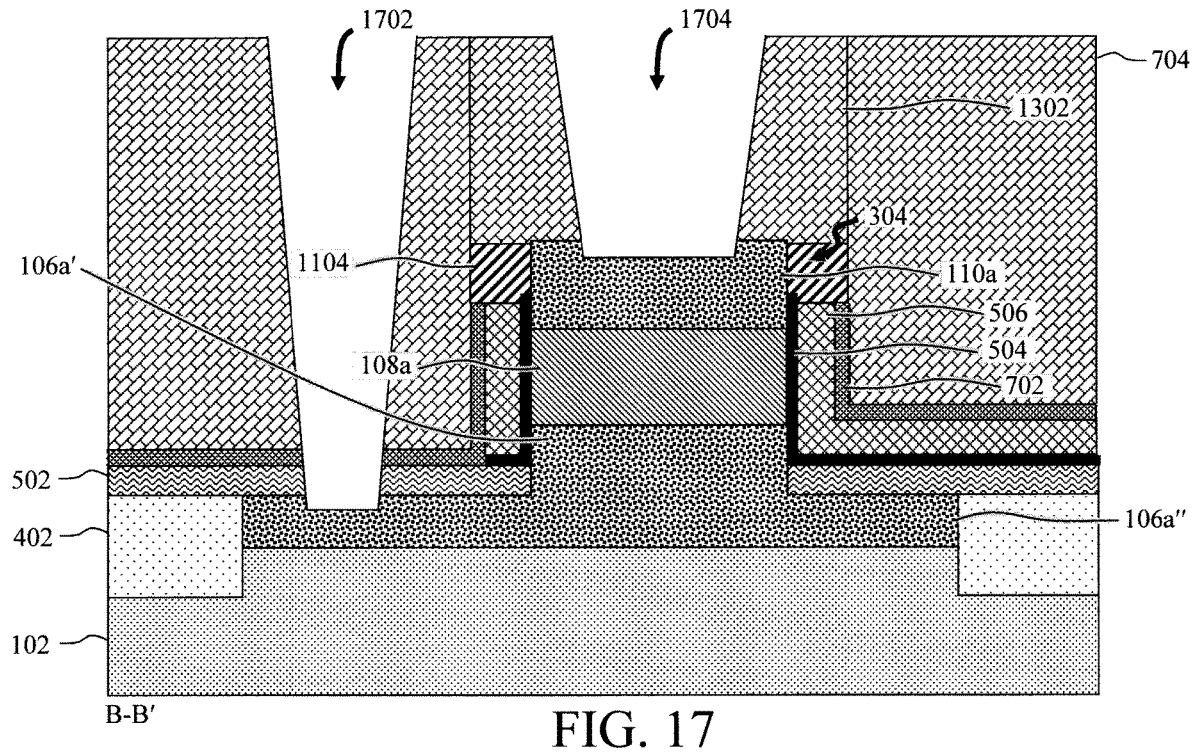
FIG. 17 is a B-B' cross-sectional view illustrating a (first) contact trench having been patterned in the first ILD down to the patterned bottom sacrificial layer, and a (second) contact trench having been patterned in the (second) ILD down to the patterned top sacrificial layer according to an embodiment of the present invention.

Standard lithography and etching techniques (see above) are then used to pattern a (first) contact trench 1702 in the (first) ILD 704 (through the liner 702 and bottom spacers 502) down to the second portion 106a" of the patterned bottom sacrificial layer, and a (second) contact trench 1704 in the (second) ILD 1302 down to the patterned top sacrificial layer 110a. See FIG. 17 (a cross-sectional view B-B'). Any other suitable patterning technique in lieu of the standard lithography and etching techniques can also be used to form contact trenches 1702 and 1704. A directional (anisotropic) etching process such as RIE can be employed for the contact trench etch. As shown in FIG. 17, depending on the selectivity of the etch, the contact trenches 1702 and 1704 can extend partway into the second portion 106a" of the patterned bottom sacrificial layer and the patterned top sacrificial layer 110a, respectively. What is important is that the second portion 106a" of the patterned bottom sacrificial layer and the patterned top sacrificial layer 110a are exposed at the bottoms of the contact trenches 1702 and 1704. As will be described in detail below, this will enable the top and bottom sacrificial layers to be selectively removed from the device structure.

Figure 18:
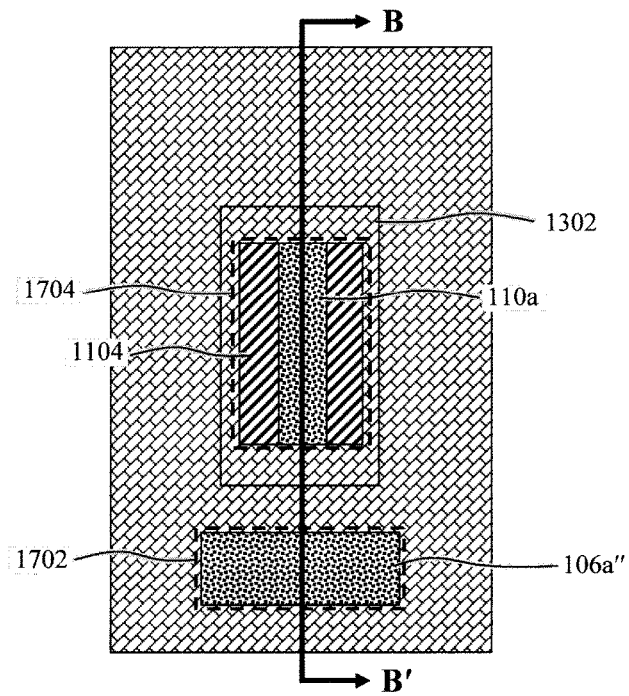
FIG. 18 is a top-down view illustrating the first contact trench having been formed down to the patterned bottom sacrificial layer and the second contact trench having been formed down to the patterned top sacrificial layer according to an embodiment of the present invention.
Figure 19:
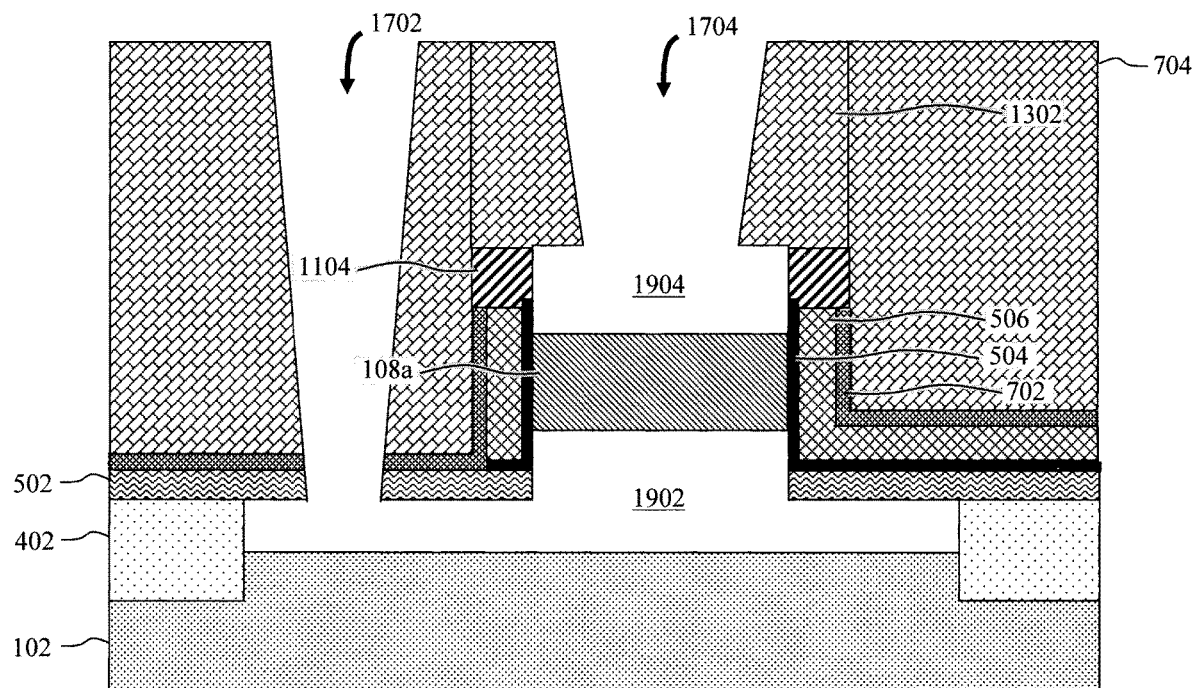
FIG. 19 is a B-B' cross-sectional view illustrating the patterned bottom sacrificial layer and the patterned top sacrificial layer having been selectively removed through the first/second contact trenches forming a (first) void and a (second) void below and above the patterned active layer (i.e., vertical fin channel) according to an embodiment of the present invention.

FIG. 18 provides a top-down view of the VFET device structure following formation of the contact trenches 1702 and 1704 (the outlines of which are shown using dashes). As highlighted above, and as exemplified in FIG. 18, formation of contact trenches 1702 and 1704 exposes the second portion 106a" of the patterned bottom sacrificial layer and the patterned top sacrificial layer 110a which will enable the select removal of the top and bottom sacrificial layers (see below).

The first/second portions 106a'/106a" of the patterned bottom sacrificial layer and the patterned top sacrificial layer 110a are then selectively removed from the VFET device structure simultaneously (i.e., at the same time) through the contact trenches 1702 and 1704, forming a (first) void 1902 and a (second) void 1904 below and above the patterned active layer 108a (i.e., vertical fin channel), respectively. See FIG. 19 (a cross-sectional view B-B'). As provided above, the first/second portions 106a'/106a" of the patterned bottom sacrificial layer and the patterned top sacrificial layer 110a can be formed from SiGe while the patterned active layer 108a can be formed from Si. In that case, the first/second portions 106a'/106a" of the patterned bottom sacrificial layer and the patterned top sacrificial layer 110a can be removed using an etchant such as wet hot SC1 (an aqueous etch solution containing ammonia and hydrogen peroxide), vapor phase hydrogen chloride (HCl), vapor phase chlorine trifluoride ($ClF_3$) and/or other reactive clean processes (RCP) that are selective for etching of SiGe relative to Si. These etchants will remove the first/second portions 106a'/106a" of the patterned bottom sacrificial layer and the patterned top sacrificial layer 110a relative to, among other things, the patterned active layer 108a. It is notable that, following removal of the first/second portions 106a'/106a" of the patterned bottom sacrificial layer and the patterned top sacrificial layer 110a, the patterned active layer 108a is anchored in place by the surrounding ILD 704.

Figure 20:
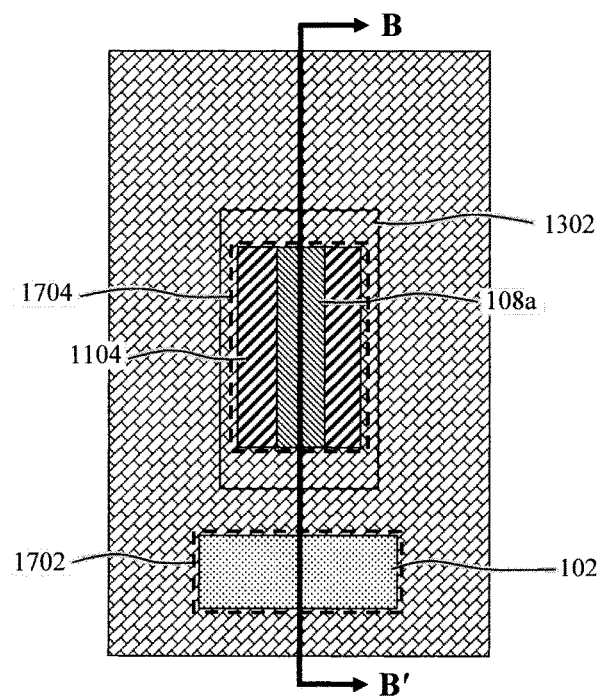
FIG. 20 is a top-down view illustrating the patterned bottom sacrificial layer and the patterned top sacrificial layer having been selectively removed according to an embodiment of the present invention.
Figure 21:
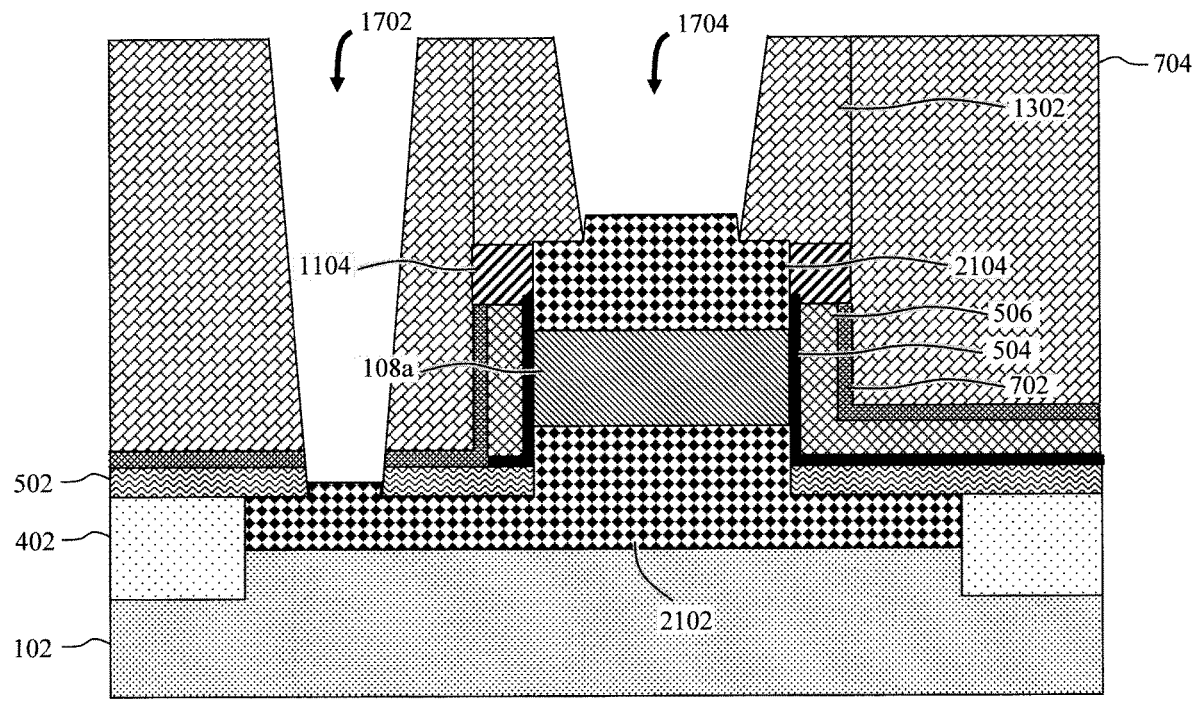
FIG. 21 is a B-B' cross-sectional view illustrating an epitaxial material having been simultaneously grown in the first/second voids to form a bottom source/drain region and a top source/drain region according to an embodiment of the present invention.

FIG. 20 provides a top-down view of the VFET device structure following removal of first/second portions 106a'/106a" of the patterned bottom sacrificial layer and the patterned top sacrificial layer 110a. As shown in FIG. 20, the substrate 102 and the patterned active layer 108a (i.e., vertical fin channel) are now visible from the top-down view through contact trenches 1702 and 1704, respectively.

An epitaxy is then grown simultaneously (i.e., at the same time) in the voids 1902 and 1904 to form bottom source/ drain region 2102 and top source/drain region 2104, respectively. See FIG. 21 (a cross-sectional view B-B'). According to an exemplary embodiment, the bottom/top source/drain regions 2102 and 2104 are formed from an in-situ doped (i.e., where a dopant(s) is introduced during growth) or ex-situ doped (e.g., where a dopant(s) is introduced by ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B).

By way of this unique process, the epitaxy for the bottom/top source/drain regions 2102 and 2104 will be grown on the surfaces of the patterned active layer 108a (i.e., vertical fin channel) exposed within the voids 1902 and 1904. Advantageously, these exposed surfaces of the patterned active layer 108a provide pristine {100} planes for the epitaxial growth thereby enabling the formation of a high-quality material for the bottom/top source/drain regions 2102 and 2104.

Following growth of the epitaxy for the bottom/top source/drain regions 2102 and 2104, an anneal is performed to form the channel-to-source/drain junction. According to an exemplary embodiment, the anneal is performed at a temperature of from about 400 degrees Celsius (° C.) to about 600° C. and ranges therebetween, for a duration of from about 1 minute to about 10 minutes and ranges therebetween. Advantageously, since the epitaxy is grown for the bottom/top source/drain regions 2102 and 2104 at the same time, only a one-time thermal budget is required for the channel-to-source/drain junction formation. Notably, doing so enables the formation of symmetric, sharp channel-to-source/drain junctions, improving device performance and reducing variability.

Figure 22:
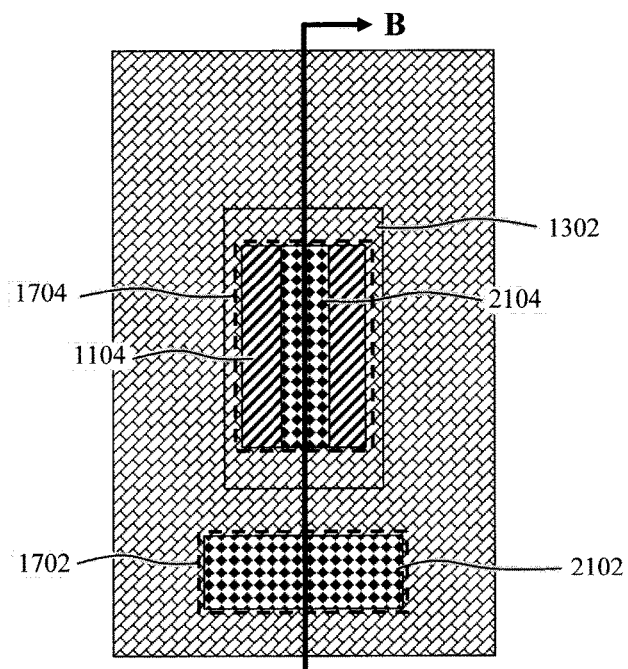
FIG. 22 is a top-down view illustrating the bottom and top source/drain regions having been formed according to an embodiment of the present invention.

FIG. 22 provides a top-down view of the VFET device structure following formation of the bottom/top source/drain regions 2102 and 2104. As shown in FIG. 22, the bottom/top source/drain regions 2102 and 2104 are now visible from the top-down view through contact trenches 1702 and 1704, respectively.

The next task is to pattern a contact trench over the gate stack. To do so, the (first/second) contact trenches 1702 and 1704 are first filled with a sacrificial fill material 2302. See FIG. 23 (a cross-sectional view B-B'). A casting process such as spin-coating or spray casting can be employed to deposit the sacrificial fill material 2302 into, and filling, the contact trenches 1702 and 1704. Following deposition, the sacrificial fill material 2302 can be planarized (e.g., using a process such as CMP or any other suitable planarization technique). The sacrificial fill material 2302 will serve to protect the bottom/top source/drain regions 2102 and 2104 during the subsequent lithography and etching processes. In some embodiments, the sacrificial material is an organic planarizing layer (OPL) material. In other embodiments, the sacrificial material is spin-on-glass (SOG).

Figure 23:
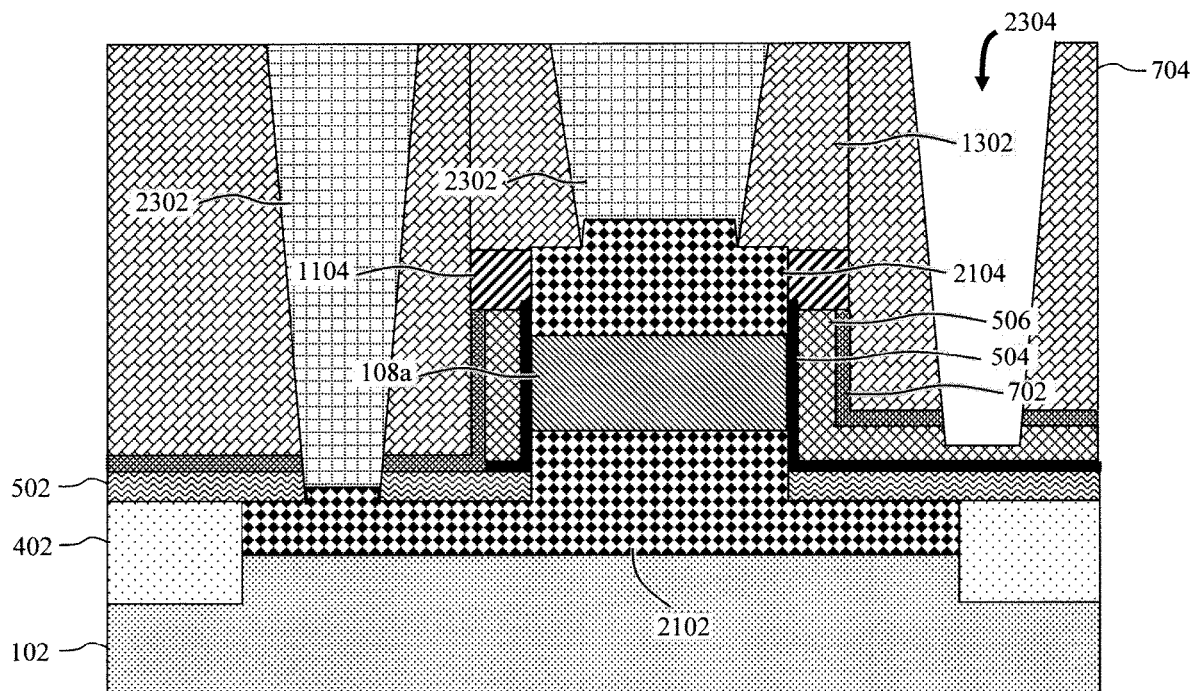
FIG. 23 is a B-B' cross-sectional view illustrating the first/second contact trenches having been filled with a sacrificial fill material, and a (third) contact trench having been patterned in the first ILD down to the gate stack according to an embodiment of the present invention.

Namely, standard lithography and etching techniques (see above) are then used to pattern a (third) contact trench 2304 in the (first) ILD 704 (through the liner 704) down to the gate stack (in particular the workfunction-setting metal(s) 506). See FIG. 23. A directional (anisotropic) etching process such as RIE can be employed for the contact trench etch. As shown in FIG. 23, depending on the selectivity of the etch, the contact trench 2304 can extend partway into the workfunction-setting metal(s) 506. However, what is important is that the workfunction-setting metal(s) 506 is exposed at the bottom of the contact trench 2304.

Figure 24:
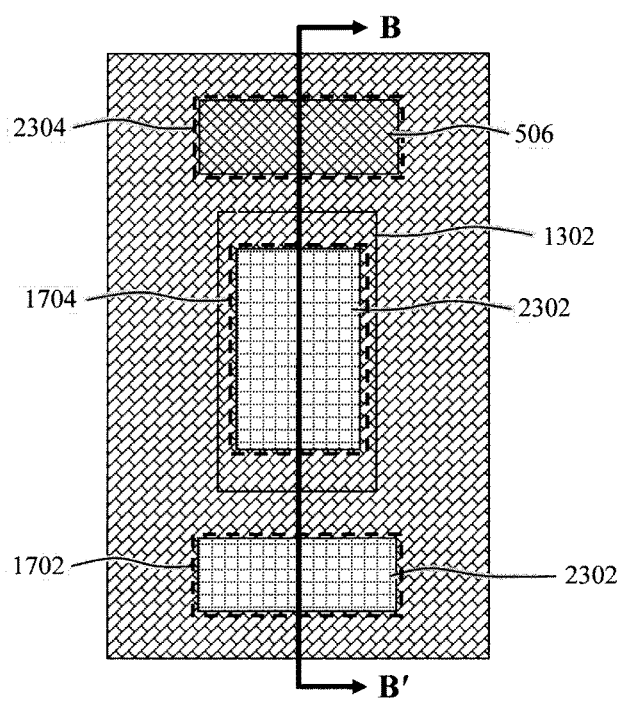
FIG. 24 is a top-down view illustrating the first/second contact trenches having been filled with the sacrificial fill material, and the third contact trench having been patterned in the first ILD down to the gate stack according to an embodiment of the present invention.

FIG. 24 provides a top-down view of the VFET device structure after the contact trenches 1702 and 1704 have been filled with sacrificial fill material 2302 and following formation of the contact trench 2304 (the outline of which is shown using dashes) in ILD 704. As shown in FIG. 24, the workfunction-setting metal(s) 506 is now visible from the top-down view through contact trench 2304. Sacrificial fill material 2302 covers the bottom/top source/drain regions 2102 and 2104 that are present at the bottoms of the contact trenches 1702 and 1704, respectively.

Following formation of contact trench 2304, the sacrificial fill material 2302 is removed from the contact trenches 1702 and 1704, and (first/second/third) contacts 2502, 2504 and 2506 to the bottom/top source/drain regions 2102/2104 and gate stack (in particular workfunction-setting metal(s) 506) are formed in the contact trenches 1702, 1704 and 2304, respectively. See FIG. 25 (a cross-sectional view B-B'). By way of example only, the sacrificial fill material 2302 can be removed from the contact trenches 1702 and 1704 using a process such as ashing.

Contacts 2502, 2504 and 2506 are formed by filling the contact trenches 1702, 1704 and 2304 with a metal or a combination of metals. Suitable metals include, but are not limited to, copper (Cu), tungsten (W), ruthenium (Ru), cobalt (Co), nickel (Ni) and/or platinum (Pt) which can be deposited into the contact trenches 1702, 1704 and 2304 using a process such as evaporation, sputtering, or electrochemical plating. Following deposition, the metal overburden can be removed using a process such as CMP. Prior to depositing the metal(s), a barrier layer (not shown) can be deposited into and lining the contact trenches 1702, 1704 and 2304. Use of such a barrier layer helps to prevent diffusion of the metal(s) into the surrounding ILD 704/1302. Suitable barrier layer materials include, but are not limited to, tantalum (Ta), TaN, titanium (Ti) and/or TiN. Additionally, a seed layer (not shown) can be deposited into and lining the contact trenches 1702, 1704 and 2304 prior to metal deposition, i.e., to facilitate plating of the metal into the contact trenches 1702, 1704 and 2304.

Figure 25:
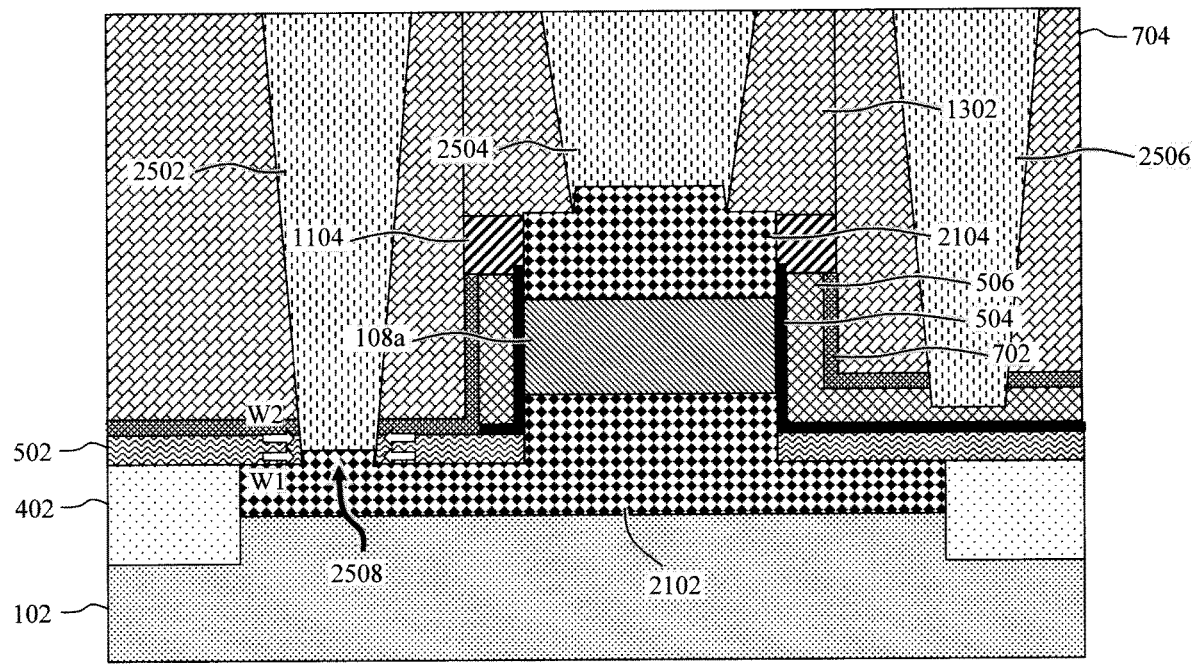
FIG. 25 is a B-B' cross-sectional view illustrating the sacrificial fill material having been removed from the first/second contact trenches, and first/second/third contacts to the bottom/top source/drain regions and gate stack having been formed in the first/second/third contact trenches according to an embodiment of the present invention.
Figure 26:
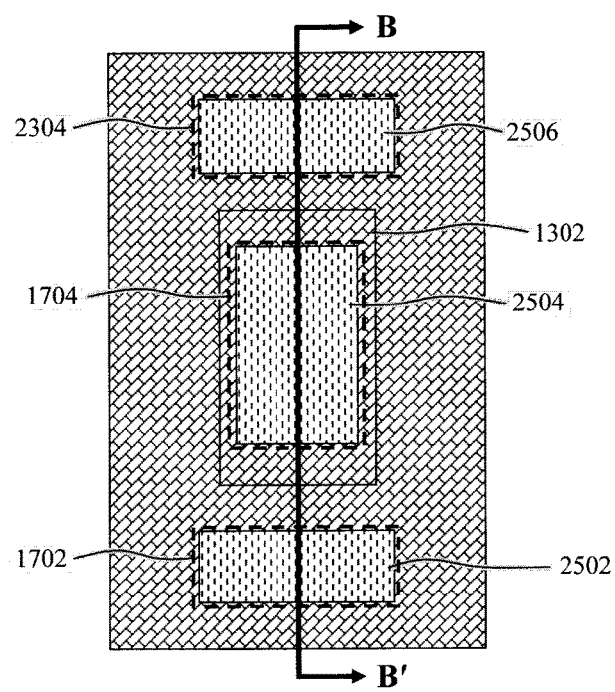
FIG. 26 is a top-down view illustrating the first/second/third contacts to the bottom/top source/drain regions and gate stack having been formed in the first/second/third contact trenches according to an embodiment of the present invention.

A unique feature of the present VFET device design is illustrated in FIG. 25. Namely, based on the above-described process whereby the (late) epitaxy for the bottom/top source/drain regions 2102 and 2104 is grown through the contact trenches 1702 and 1704, a portion of that epitaxy can extend into the contact trenches 1702 and 1704. As a result, a portion 2508 of the bottom source/drain region 2102 extends up through the bottom spacers 502 beneath the contact 2502. Notably, a width W1 of this portion 2508 of the bottom source/drain region 2102 is substantially the same as a width W2 of a bottom of the contact 2502, i.e., W1 W2. For instance, W1 differs from W2 by less than or equal to about 0.5 nm. FIG. 26 provides a top-down view of the VFET device structure following the formation of contacts 2502, 2504 and 2506 in the contact trenches 1702, 1704 and 2304.

Figure 27:
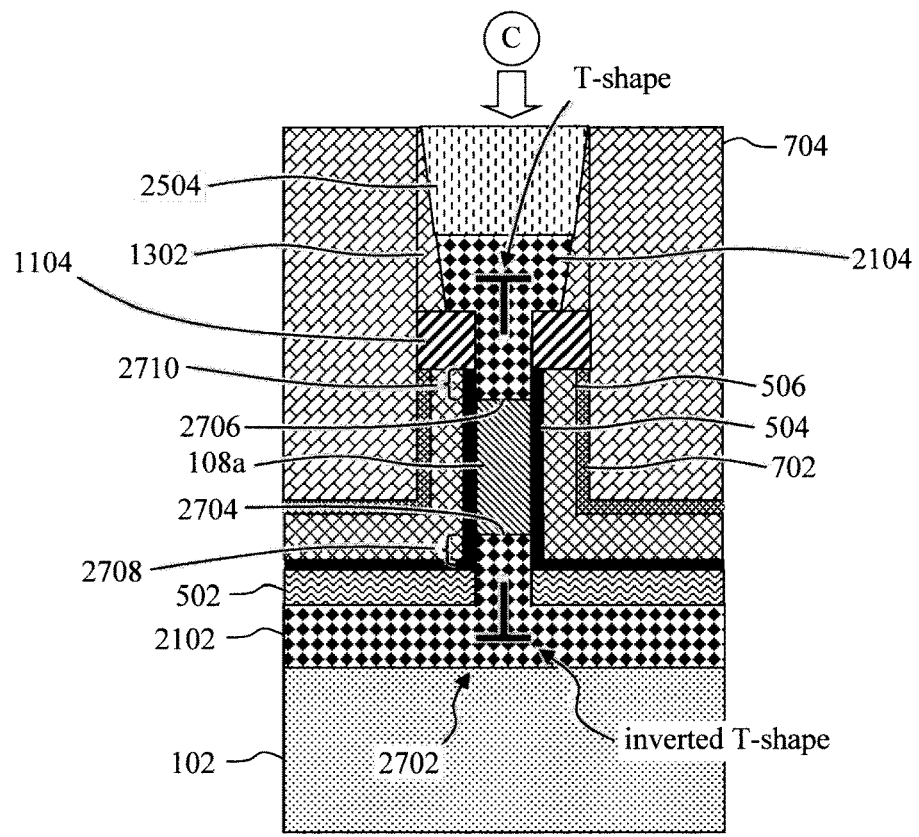
FIG. 27 is an A-A' cross-sectional view illustrating the device structure from another perspective according to an embodiment of the present invention.

FIG. 27 provides another view (a cross-sectional view A-A') of the present VFET device structure. As shown in FIG. 27, the gate stack (i.e., gate dielectric 504 and workfunction-setting metal(s) 506) is present alongside the patterned active layer 108a (i.e., vertical fin channel). The bottom/top source/drain regions 2102 and 2104 are present below and above the vertical fin channel, offset from the gate stack by the bottom and top spacers 502 and 1104, respectively. Contact 2504 is visible in this depiction, and is disposed over the top source/drain region 2104.

Other unique features of the present VFET device design are illustrated in FIG. 27. Namely, based on the above-described late epitaxy process, the bottom source/drain region 2102 is present directly below the patterned active layer 108a (i.e., vertical fin channel). By comparison, as highlighted above, with conventional approaches to VFET fabrication the bottom source/drain epitaxy is grown in the substrate in between the vertical fin channels. As a result, with the conventional approach the bottom source/drain region will not be present directly below the channel.

As also shown in FIG. 27, the bottom source/drain region 2102 has an inverted T-shape configuration below the patterned active layer 108*a* (i.e., vertical fin channel), while the top source/drain region 2104 has a T-shaped configuration over the patterned active layer 108*a* (i.e., vertical fin channel). This unique configuration of the bottom/top source/drain regions 2102 and 2104 is a result of the late epitaxy approach to replace the first and second portions 106*a*' and 106*a*" of the patterned bottom sacrificial layer and the patterned top sacrificial layer 110*a* as described in detail above. Also, as a result of this process, the bottom source/drain region has a flat bottom 2702 directly below the patterned active layer 108*a* (i.e., vertical fin channel). See FIG. 27.

Figure 28:
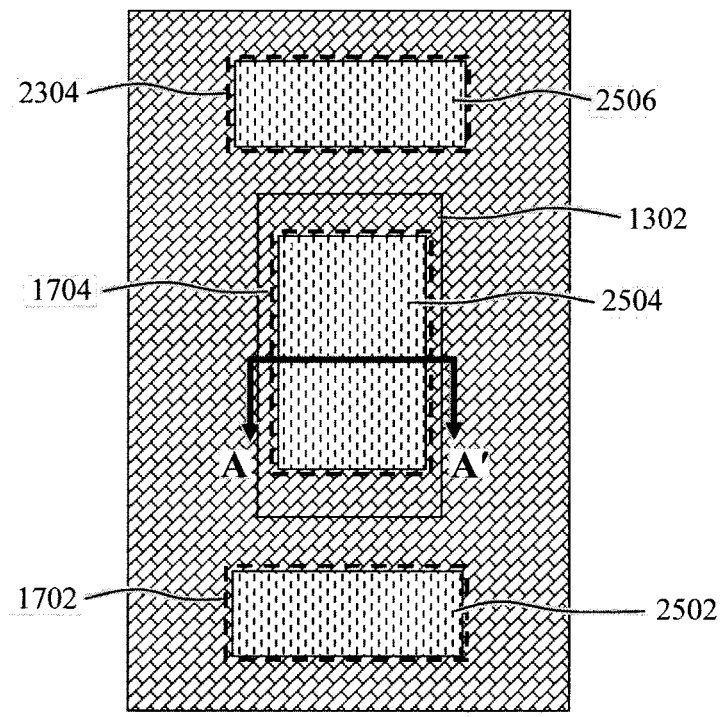
FIG. 28 is a top-down view illustrating an orientation of the A-A' cuts depicted in FIG. 27 according to an embodiment of the present invention.

As yet another point of comparison, with conventional approaches to VFET fabrication, the bottom and top source/drain epitaxy are grown at different times. Namely, the bottom source/drain epitaxy is typically grown early on in the process (i.e., prior to placement of the bottom spacers, gate, etc.). The top source/drain epitaxy is grown late in the process (i.e., after placement of the top spacers). In that case, asymmetry in bottom and top channel-to-source/drain junctions is inevitable. By comparison, with the present late epitaxy process, the bottom/top source/drain regions 2102 and 2104 are formed at the same time, followed by a junction forming anneal. See above. As a result, a junction 2704 between the vertical fin channel and the bottom source/drain region and a junction 2706 between the vertical fin channel and the top source/drain region are symmetric. See FIG. 27. By symmetric, it is meant for example that a portion 2708 of the bottom source/drain region 2102 overlaps the gate stack (i.e., gate dielectric 504 and workfunction-setting metal(s) 506) by substantially the same amount as a portion 2710 of the top source/drain region 2104 overlaps the gate stack (i.e., gate dielectric 504 and workfunction-setting metal(s) 506). For instance, the amount of overlap between portions 2708 and 2710 and the gate stack differs by less than or equal to about 0.5 nm. FIG. 28, a top-down view from viewpoint C (see FIG. 27), illustrates the orientation of the A-A' cut (of the actual device region) depicted in FIG. 27.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A vertical field-effect transistor (VFET) device, comprising:
   at least one vertical fin channel disposed on a substrate;
   a gate stack alongside the at least one vertical fin channel;
   a first portion of a bottom source/drain region directly below the at least one vertical fin channel;
   a second portion of the bottom source/drain region extends up through bottom spacers;
   a first contact directly above the second portion of the bottom source/drain region, wherein the portion of the bottom source/drain region has a same width as a width of a bottom of the first contact; and
   a top source/drain region over the at least one vertical fin channel.

2. The VFET device of claim 1, wherein the bottom source/drain region has an inverted T-shape.

3. The VFET device of claim 1, wherein the top source/drain region has a T-shape.

4. The VFET device of claim 1, further comprising:
   a second contact to the top source/drain region; and
   a third contact to the gate stack.

5. The VFET device of claim 1, wherein the portion of the bottom source/drain region has a width W1, wherein the bottom of the first contact has a width W2, and wherein W1≈W2.

6. The VFET device of claim 1, wherein the bottom source/drain region has a flat bottom below the at least one vertical fin channel.

7. The VFET device of claim 1, wherein a junction between the vertical fin channel and the bottom source/drain region and a junction between the vertical fin channel and the top source/drain region are symmetric.

8. The VFET device of claim 1, further comprising:
   a conformal liner disposed on the gate stack.

9. The VFET device of claim 1, wherein the gate stack comprises:
   a gate dielectric disposed on the at least one vertical fin channel; and
   at least one workfunction-setting metal disposed on the gate dielectric.

10. The VFET device of claim 1, wherein the top source/drain region is offset from the gate stack by top spacers, and wherein the sloped sidewall of the top source/drain region are present above the top spacers such that the top source/drain region contacts only a portion of a top surface of each of the top spacers.

11. The VFET device of claim 9, wherein the top source/drain region is offset from the gate stack by top spacers, and wherein both the gate dielectric and the at least one workfunction-setting metal directly contact the top spacers.

12. A vertical field-effect transistor (VFET) device, comprising:
   at least one vertical fin channel disposed on a substrate;
   a gate stack alongside the at least one vertical fin channel;
   a bottom source/drain region directly below the at least one vertical fin channel offset from the gate stack by bottom spacers, wherein a portion of the bottom source/drain region extends up through the bottom spacers;
   a first contact directly above the portion of the bottom source/drain region, wherein the portion of the bottom source/drain region has a same width as a width of a bottom of the first contact; and
   a top source/drain region over the at least one vertical fin channel offset from the gate stack by top spacers.

13. The VFET device of claim 12, further comprising:
   a second contact to the top source/drain region; and
   a third contact to the gate stack.

14. The VFET device of claim 12, wherein the portion of the bottom source/drain region that extends up through the bottom spacers has a width W1, wherein a bottom of the first contact has a width W2, and wherein W1≈W2.

15. The VFET device of claim 12, wherein the gate stack comprises:
   a gate dielectric disposed on the at least one vertical fin channels; and
   at least one workfunction-setting metal disposed on the gate dielectric, and wherein both the gate dielectric and the at least one workfunction-setting metal directly contact the top spacers.

* * * * *